United States Patent [19]
Date et al.

[11] Patent Number: 6,080,443
[45] Date of Patent: Jun. 27, 2000

[54] METHOD FOR PRODUCTION OF MICROCAPSULE TYPE CONDUCTIVE FILLER

[75] Inventors: Hiroaki Date; Makoto Usui; Isao Watanabe; Yuko Hozumi, all of Kawasaki, Japan

[73] Assignee: Fujitsu Limited, Kawasaki, Japan

[21] Appl. No.: 08/986,151

[22] Filed: Dec. 5, 1997

Related U.S. Application Data

[63] Continuation of application No. 08/372,904, Jan. 17, 1995, abandoned, which is a continuation of application No. 07/964,608, Oct. 23, 1992, abandoned.

[30] Foreign Application Priority Data

Oct. 24, 1991 [JP] Japan ................................. 3-303818
Sep. 4, 1992 [JP] Japan ................................. 4-263219

[51] Int. Cl.$^7$ .............................. B01J 13/20; B05D 7/14
[52] U.S. Cl. ............................... 427/213.33; 427/213.32; 427/213.34; 427/213.36; 252/514; 523/200; 523/202; 523/205; 523/459
[58] Field of Search ...................... 252/500, 512, 252/513, 514, 518; 427/213.34, 216, 221, 213.32, 213.33, 213.36; 428/407; 524/801, 802, 804; 523/200, 202, 205, 459

[56] References Cited

U.S. PATENT DOCUMENTS

| | | | |
|---|---|---|---|
| 3,935,340 | 1/1976 | Yamaguchi et al. | 427/216 |
| 3,969,547 | 7/1976 | Isawa et al. | 427/216 |
| 4,105,714 | 8/1978 | Trepka et al. | 526/26 |
| 4,508,761 | 4/1985 | Miyoshi et al. | 427/221 |
| 4,620,987 | 11/1986 | Yamashita et al. | 427/216 |
| 4,689,250 | 8/1987 | Quella et al. | 252/512 |
| 4,833,033 | 5/1989 | Sannohe et al. | 252/518 |
| 4,874,858 | 10/1989 | Magistro | 544/196 |
| 5,399,432 | 3/1995 | Schleifstein et al. | 428/403 |

FOREIGN PATENT DOCUMENTS 62-115061  5/1987  Japan .

OTHER PUBLICATIONS

*Patent Abstracts of Japan,* vol. 17, No. 233 (M–1407) May 12, 1993 (JP 4–362104).
Database WPI, Week 934, AN 93–033291 (JP 4–362104), *Derwent Publications Ltd.,* London, GB.
Database WPI, Week 9220, AN 92–162197 (JP 4–96981), *Derwent Publications Ltd.,* London, GB.
*Patent Abstracts of Japan,* vol. 14, No. 316 (E–949) Jul. 6, 1990 (JP 2–103874).

*Primary Examiner*—Robert E. Sellers
*Attorney, Agent, or Firm*—Staas & Halsey, LLP

[57] ABSTRACT

A process for producing a MC-type conductive filler includes treating minute metallic particles with a coupling agent, preparing an oil phase of the coupling agent-treated minute metallic particles and a reactive substance A, the reactive substance A directly contacting the metallic particles. Then, an aqueous phase is prepared having a reactive substance B, which is capable of reacting with the reactive substance A, dissolved in water. Thereafter, the oil phase is dispersed in the aqueous phase to form a suspension. In situ reaction of the reactive substances A and B is then caused by applying heat to the suspension or adding a catalyst to the suspension. This forms a coating of a thermosetting insulating resin on the surface of the minute metallic particles. Alternatively, the reactive substance B may not be used. A MC-type conductive filler may also be made by immersing minute metallic particles in an affinity agent, immersing and dispersing the affinity agent treated-particles in an epoxy monomer and polymerizing the monomer to form an insulating polymer on the surface of the minute metallic particles.

4 Claims, 13 Drawing Sheets

METHOD FOR PRODUCTION OF MICROCAPSULE TYPE CONDUCTIVE FILLER

This application is a continuation of application Ser. No. 08/372,904, filed Jan. 17, 1995, now abandoned, which is a continuation of application Ser. No. 07/964,608, filed Oct. 23, 1992, now abandoned.

BACKGROUND OF THE INVENTION

1. Field of the Invention

This invention relates to a method for the production of a microcapsule (MC) type conductive filler and more particularly to a method for coating the surface of minute conductive particles with an insulating polymer and to an MC type adhesive agent having dispersed in an adhesive agent the coated MC type conductive filler.

2. Description of the Related Art

In the conventional method of adhesion, the adhesion effected by soft soldering or welding where the interface produced by this adhesion requires conductivity. The conventional method is effectively applicable only to a limited number of materials because of the heat factor. In contrast, the organic-inorganic composite conductive adhesive agent that is composed of a binder using a synthetic resin as a main component thereof and a conductive filler using a metal powder as a main component thereof finds utility in a wide variety of applications that involving different kinds of materials subjected to adhesion. This adhesive agent, therefore, is an indispensable medium for conductive adhesion of plastic substances (such as epoxy and phenol resins) that do not adhere by soft soldering, for adhesion of NESA glass used in liquid crystal display devices, for adhesion of phosphor bronze with a carbon brush used in micrometers, and for adhesion of lead wires as in quartz oscillators and sdc meters, for example.

Particularly, in the semiconductor industry, which has been enjoying significant growth recently, IC's and LSI's of increasingly high quality have been developed and mass produced. For the adhesion of these semiconductor chips (silicon wafers) to lead frames, though the method involving to an Au—Sn eutectic once prevailed, conductive adhesive agents formed by kneading an epoxy resin with silver powder now have multiple applications utility owing to their ability to lower cost and enhance productivity.

As a resin binder for conductive adhesive agents, while epoxy resin is generally used, polyimide type, phenol type, and polyester type resins are also used, though only partially. As a conductive filler, minute particles of such metals as gold, silver, and copper and amorphous carbon and graphite powder are generally used as well as metal oxides, though only partially. Silver powder is preferably used over the conductive fillers cited above because it is inexpensive, reliable and effective.

The conductive adhesive agent is advantageous in various respects compared with conventional applications such as soft soldering and welding though it is not perfectly free from fault. When this conductive adhesive agent is used between an LSI chip and patterns for mounting component parts, for example, an increase in the amount of minute conductive particles that are incorporated in the conductive adhesive agent lowers insulation resistance as illustrated in FIG. 1 and increases the possibility of adjacent patterns forming electric continuity. A reduction in the amount of minute conductive particles reduces the electric continuity between the LSI and the patterns. Data indicate the necessity for rigidly controlling the amount of minute conductive particles to be used in the conductive adhesive agent. And at the same time, reveal the fact that the minute conductive particles cannot be used in large amounts.

It is believed possible that this problem can be solved by a procedure that comprises preparing an MC type conductive adhesive agent having dispersed in an adhesive agent, an MC type conductive filler formed by coating the surface of minute conductive particles with an insulating polymer, applying the MC type conductive adhesive agent to the entire surface of the substrate of an IC or LSI chip, exerting pressure to bear on the interface between the chip and patterns deposited thereon, thereby rupturing the coating layer of the capsules and establishing electric continuity between the chip and the patterns, and meanwhile allowing the encapsulated minute conductive particles interposed between the adjacent patterns to remain intact and continue to insulate these patterns from one another.

The insulating resins that are usable for coating the surface of minute conductive particles include thermoplastic resins and thermosetting resins as classified by kind. In terms of resistance to moisture absorption and electric insulating properties, thermosetting resins definitely excel thermoplastic resins. Since thermocompression bonding of a chip to a substrate is generally carried out at an elevated temperature of at least 170° C., the insulating resin to be used is required to be stable enough to resist this elevated temperature though few thermoplastic resins can endure this temperature. In contrast, most thermosetting resins can tolerate temperatures in the neighborhood of 200° C.

For use as an insulating resin in the MC type conductive filler, thermosetting resins that are advantageous in various respects over thermoplastic resins are suitable.

For the application of an insulating resin coating to the surface of minute conductive particles, however, the procedure that involves dissolving the resin in a solvent, spraying the solution on the surface of the minute conductive particles, and drying the applied coating of the solution is predominant though since thermosetting resins are insoluble in solvents, this procedure applied conventionally is difficult and the application of a thermosetting resin coating to the surface of minute conductive particles, therefore, necessitates development of a novel coating procedure.

The prior techniques pertaining to the MC type conductive adhesive agent have been disclosed by Japanese Unexamined Patent Publications No. 176,139/1987, No. 76,215/1987, No. 47,943/1988, No. 54,796/1988, No. 103,874/1990, and No. 103,875/1990, for example.

First, the disclosures of Japanese Unexamined Patent Publications No. 176,139/1987, No. 76,215/1987, No. 47,943/1988, and No. 54,796/1988 will be described. These patent publications disclose, as conductive adhesive agents, those produced by forming an intermediate conductive layer on spherical cores of resin and coating the intermediate layer with a surface layer of an insulating thermoplastic resin and those produced by coating the surface of minute spherical conductive particles with an insulating thermoplastic resin. Actual mounting of a chip on a substrate for a printed circuit by using such a conductive adhesive agent is attained by a procedure that comprises applying the conductive adhesive agent to the substrate and thermocompression bonding the chip to the substrate so that the intermediate layer or the minute conductive particles will discharge a conductive function and the insulating thermoplastic resin an adhesive function and an insulating function. The techniques disclosed by these patent publications differ from the method using the MC type conductive adhesive agent of the present invention and these patent publications do not mention using a thermosetting resin as an insulating resin for coating the surface of the minute conductive particles.

Now, the disclosure of Japanese Unexamined Patent Publication No. 103,874/1990 will be described below. The invention of this patent publication pertains to an MC type conductive adhesive agent produced by dispersing in a film of an insulating adhesive agent serving as a binder an MC type conductive filler having minute conductive particles coated with an insulating thermoplastic resin or thermosetting resin. Conductive union of two given members using this MC type conductive adhesive agent is accomplished by depositing this adhesive agent on the two members and pressing the two members against each other while being heated state. Thus, in the part expected to form electric continuity, the impact of the pressure exerted as described above ruptures the insulating resin layer of the MC filler and establishes the desired electric continuity, whereas in the part requiring insulation, the MC type conductive filler is allowed to remain intact and, therefore, retain stable insulation. Incidentally, this MC type conductive filler is manufactured by plasma polymerization or plasma CVD polymerization and there are times when the insulating film of the MC type filler may be formed of a thermosetting resin. The number of kinds of thermosetting resins that can be manufactured by the plasma polymerization and the plasma CVD polymerization is very small because the number of kinds of gases usable for injection during the polymerization is not large. Further in accordance with this method of plasma polymerization or plasma CVD polymerization, the cost is sufficiently high to render the manufacturing thereof impracticable and productivity is inferior because the amount of MC type filler to be manufactured is small.

The disclosure of Japanese Unexamined Patent Publication No. 103,875/1990 will be described below. The invention of this patent publication pertains to the use of an MC type conductive adhesive agent produced by coating minute conductive particles with an insulating thermoplastic resin or thermosetting resin. Actual mounting of a chip on a substrate for a printed circuit using this MC type conductive adhesive agent is attained by applying the conductive adhesive agent to the substrate and thermocompression bonding the chip to the substrate, with the intermediate layer or the minute conductive particles discharging a conductive function and the insulating resin on the surface of the minute conductive particles an adhesive function and an insulating function. Incidentally, this MC type conductive filler is manufactured by either plasma polymerization or plasma CVD polymerization. Thus, these prior techniques are described as allowing what is formed by coating the surface of minute conductive particles with a thermosetting resin. In spite of these disclosures, thermosetting resins should be unusable for the purpose of coating because they do not melt with heat and, therefore, are incapable of functioning as an adhesive. Even if a thermosetting resin is used, the method of manufacturing the MC type conductive filler entails a serious drawback as pointed out in Japanese Unexamined Patent Publication No. 103,874/1990.

Practically all the prior techniques pertaining to the manufacture of an MC type conductive filler or the conductive adhesive agent using this filler invariably use a thermoplastic resin. Even when the patent publications mention usability of a thermosetting resin, methods of manufacturing using such a thermosetting resin are not disclosed with sufficient specificity or are devoid of practicability and thus, these methods cannot be actually used.

SUMMARY OF THE INVENTION

This invention has been produced for the purpose of solving the problems encountered by the prior art as described above. The first aspect of this invention, i.e. the method for production of an MC type conductive filler is characterized by dispersing minute conductive particles (oil phase) allowing the presence of either both a solvent and a reactive substance A or the aforementioned reactive substance A alone on the surface thereof in water having dissolved therein a reactive substance B capable of reacting with the reactive substance A (aqueous phase) thereby forming a suspension or causing either a solvent and at least one reactive substance or, as aforementioned, at least one reactive substance alone to be present on the surface of minute conductive particles (oil phase) and dispersing the minute conductive particles in water thereby forming a suspension and applying heat or adding a catalyst to the suspension thereby inducing the reactive substance to react on the surface of the minute conductive particles thereby forming a thermosetting, thermoplastic, or combined thermosetting-thermoplastic insulating resin.

The second aspect of this invention, i.e. the MC type conductive adhesive agent is produced by dispersing in an adhesive agent an MC type conductive filler that is produced by dispersing minute conductive particles (oil phase) allowing the presence of either a solvent and a reactive substance A both or the aforementioned reactive substance A alone on the surface thereof in water having dissolved therein a reactive substance B capable of reacting with the reactive substance A (aqueous phase) thereby forming a suspension or causing either a solvent and at least one reactive substance or, as aforementioned, at least one reactive substance alone to be present on the surface of minute conductive particles (oil phase) and dispersing the minute conductive particles in water thereby forming a suspension and applying heat or adding a catalyst to the suspension thereby inducing the reactive substance to react on the surface of the minute conductive particles thereby forming a thermosetting, thermoplastic, or combined thermosetting-thermoplastic insulating resin.

The term "reactive substance" as used in this specification refers to a substance that is capable of forming an insulating polymer on the surface of a filler either by itself or through reaction with another reactive substance. The substances that answer this description include monomer components, oligomer components, and polymer components that form an insulating polymer, for example.

The third aspect of this invention, i.e. the method for production of an MC type conductive filler comprises (a) a step of immersing minute conductive particles in an affinity agent thereby treating the surface of the minute conductive particles, (b) a step of immersing and dispersing the surface-treated minute conductive particles in an epoxy monomer thereby forming a suspension, and (c) a step of polymerizing the monomer in the suspension thereby forming a thermosetting insulating polymer on the surface of the minute conductive particles.

The fourth aspect of this invention, i.e. the MC type conductive adhesive agent, is produced by dispersing in an adhesive agent the MC conductive filler obtained by the method described above.

BRIEF DESCRIPTION OF THE DRAWINGS

The invention will be better understood and objects and advantages other than those set forth above will become apparent when consideration is given to the following detailed description thereof. The description makes reference to the annexed drawings wherein.

DETAILED DESCRIPTION OF THE PREFERRED EMBODIMENTS

Figure 1:
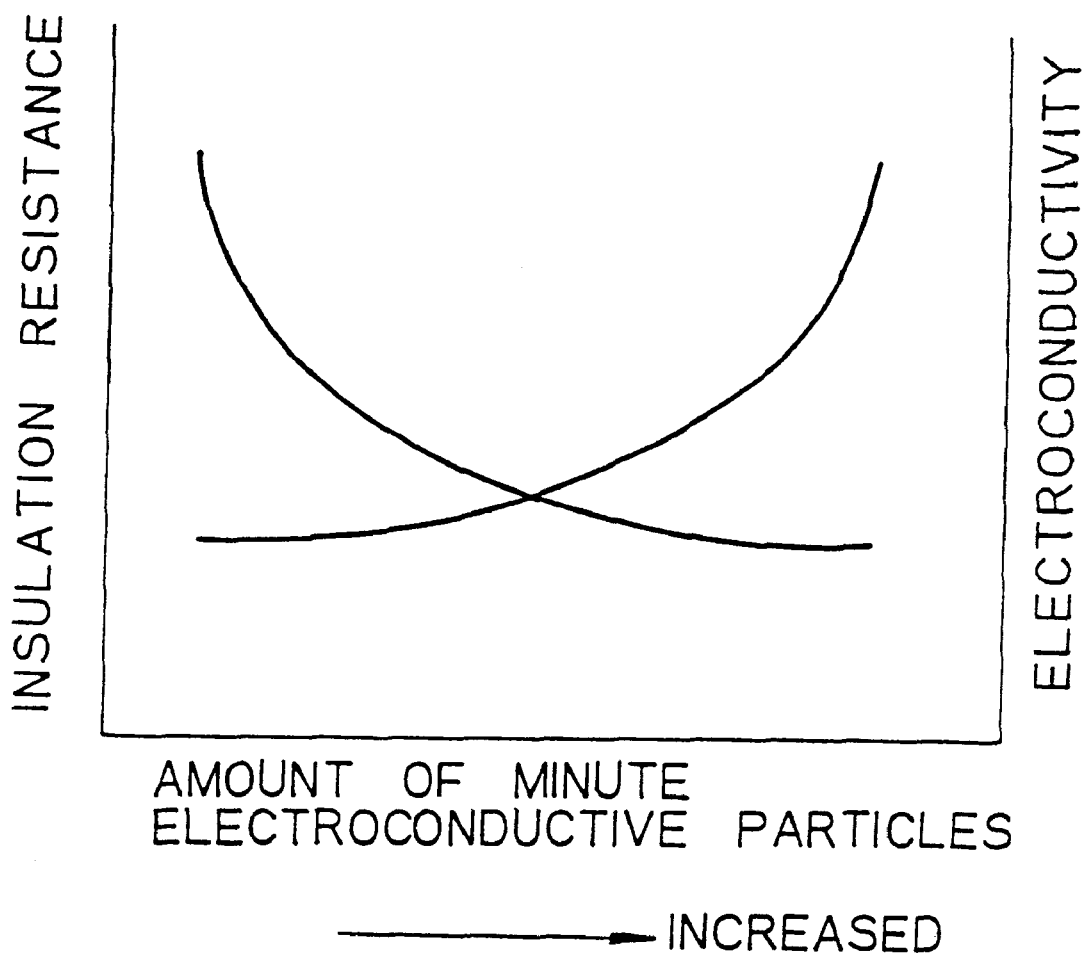
FIG. 1 is a graph showing the relation between insulation resistance and conductivity with the amount of minute conductive particles as a parameter.

The principle for the production of an MC conductive filler will be described below.

(Production using one kind of monomer)

A suspension is produced by dispersing minute conductive particles having the surface thereof treated with a coupling agent in a solution of a monomer and a reaction initiator (oil phase) and adding the resultant dispersion dropwise to water having an emulsifier and a viscosity enhancer dissolved therein (aqueous phase). By applying heat to this suspension, for example, the monomer is polymerized in situ on the surface of the minute conductive particles and allowed to form a coating thereon. Examples of the monomer that is usable singly herein are divinyl benzene and acryl. A thermosetting polymer is obtained from divinyl benzene monomer and a thermoplastic polymer from acryl monomer.

(Production using two or more kinds of monomers)

A suspension is produced by dispersing minute conductive particles having the surface thereof treated with a coupling agent in the solution of a monomer in a solvent (oil phase) and adding the resultant dispersion dropwise to water having another monomer, an emulsifier, and a viscosity enhancer dissolved therein (aqueous phase). By applying heat or adding a catalyst to this suspension, the monomers are interfacially polymerized on the surface of the minute conductive particles and allowed to coat the minute conductive particles. The coating can be alternatively effected by preparing a suspension having at least two kinds of monomers dissolved in the oil phase and subjecting the monomers to in situ polymerization. Examples of the monomers that are usable in the form of a combination of two monomers herein are epoxy/amine and bismaleimide/amine (both producing a thermosetting polymer).

In the production of the MC conductive filler, the following points must be taken into consideration.

(1) The minute conductive particles should be treated in advance with a coupling agent. (2) The sp value of the coupling agent to be used for this treatment should be within $\pm 10$ $(cal/cm^3)^{1/2}$ of that of the monomer to be used. (3) The viscosity of the aqueous phase should be in the range between 20 and 10,000 cps. (4) The suspension should be stirred at a rate in the range between 50 and 250 rpm to effect the reaction of the monomer. The reason for (1) is that since the monomolecular film of the coupling agent on the surface of the minute conductive particles and the monomer molecules are intertwined, the monomer is retained on the surface of the minute conductive particles and the coating is effected uniformly. The reason for (2) is that if the sp value deviates from the range of $\pm 10$ $(cal/cm^3)^{1/2}$, the monomer is not thoroughly intertwined with the coupling agent and it is retained on the surface of minute conductive particles with difficulty. The reason for (3) is that the minute conductive particles settle and agglomerate if the viscosity is less than 20 cps and the separation of the MC type conductive filler after completion of the coating is not obtained if the viscosity exceeds 10,000 cps. The reason for (4) is that the minute conductive particles settle and agglomerate during the reaction of the monomer if agitation is omitted.

The minute conductive particles to be used for this method of production of the filler are only required to be made of a conductive metallic material. The kind of metallic material is irrespective. For example, minute Cu particles having the surface thereof coated with Ag or minute Ag particles are preferably used.

The minute conductive particles are preferably spheres or pseudospheres in shape. These minute conductive particles preferably have a diameter of not more than 50 $\mu$m.

The insulating layer of a thermosetting resin for the MC type conductive filler is preferably made of a cured epoxy/amine or bismaleimide/amine type resin. The insulating layer of thermosetting resin of the MC type conductive filler preferably has a thickness of not more than 3 $\mu$m.

This invention pertains in one aspect of an MC type conductive adhesive agent having dispersed in an adhesive agent the filler obtained as described above. The adhesive agent that can be effectively used in the MC type conductive adhesive agent is the same as mentioned above. For example, an epoxy type one-component polyimide or polyester adhesive agent is preferably used.

The viscosity of the adhesive agent mentioned above is preferably not more than 150,000 cps. The content of the MC type conductive filler in the MC type conductive adhesive agent is preferably not more than 50% by volume.

One preferred embodiment of the method of this invention comprises forming a suspension by uniformly dispersing minute conductive particles allowing the presence of a solvent and a monomer (monomer A) on the surface thereof in water having another monomer (monomer B) dissolved therein and applying heat to the suspension thereby inducing the two monomers to react on the surface of the minute conductive particles and form an insulating polymer and consequently producing a microcapsule type filler. In this method, the monomer A and the monomer B are monomer components that are intended to form an insulating polymer. When a polyamide is intended to form the insulating polymer, for example, adipic acid dichloride serves as the monomer A and hexamethylene diamine as the monomer B. Where polyurethane is intended to form the insulating polymer, for example, tetramethylene diisocyanate serves as the monomer A and methamethylene glycol as the monomer B.

The solvents that are effectively usable for dissolving the monomer A include dichloroethane, chloroform, carbon tetrachloride, xylene, toluene, benzene, dichloromethane, and ethyl acetate, for example. The suspension is heated for the purpose of promoting the reaction of the monomers therein. The temperature of this heating is in the range between normal room temperature and boiling point of the solvent. It is selected in accordance with the particular quality of the suspension to be heated.

In the method described above, the minute conductive particles must be treated with a coupling agent before using. This treatment serves the purpose of fixing the monomer A on the minute conductive particles.

Further, in the method described above, the viscosity of the aqueous phase having the monomer B dissolved therein is preferably adjusted so as to fall in the range between 20 and 10,000 cps by the addition of a viscosity enhancer. During the application of heat to the suspension mentioned above, the suspension must be stirred at a rate in the range between 50 and 250 rpm for reacting the two monomers.

The monomers are preferably used in an amount that is at least sufficient for the monomers to form a film of not less than 0.05 μm in thickness on the surface of the minute conductive particles.

Now, the present invention will be described in detail below with reference to working examples. Of course, this invention is not limited to the working examples.

The affinity enhancer such as triazine thiol, which is used at the step (a) in the method, i.e. the third aspect of this invention, allows effective polymerization of the monomers because it is capable of inducing uniform adhesion of the epoxy resin monomer to the surface of the minute metallic particles and opening the heterocycles in the resin. The concentration of triazine thiol should not be more than $10^{-3}$ mol/liter. As a result, the heretofore difficult coating of the surface of the minute conductive particles with the thermosetting resin can be easily attained by the method of this invention. Further, since the coating film of the thermosetting resin is superior to the coating film of a thermoplastic resin in strength, the MC type conductive filler can be incorporated in a large amount in the adhesive agent and the MC type conductive adhesive agent consequently produced can effect an adhesive union of two given members with higher reliability than the conventional technique.

Now, this invention will be described more specifically below with reference to working examples, which are illustrative of and not limitative in any sense of this invention.

Examples 1 to 13 and Comparative Examples 1 to 3 cited hereinbelow pertain to the first and second aspects of this invention.

EXAMPLE 1

A microcapsule type conductive adhesive agent was produced with the following materials.

Minute conductive particles: Minute pseudospheres of Cu having the surface thereof plated with Ag (Ag/Cu, average diameter 5 μm).

Dispersant: Titanate type coupling agent.

Monomers: Bisphenol A type epoxy (BPA) and tetraethylene pentamine (TEPA).

Adhesive agent: Epoxy type one-component adhesive agent.

(1) Production of Microcapsule Type Conductive Filler (using a monomer and a solvent respectively in oil phase and aqueous phase).

Coating of silver powder with cured BPA and TEPA.

An aqueous phase was prepared by dissolving 25 g of polyvinyl alcohol, 2 g of an emulsifier, and 10 g of TEPA in 400 ml of water. An oil phase was prepared by dissolving 7 g of BPA in 15 ml of dichloroethane and adding to the resultant solution 15 g of silver powder treated with a titanate type coupling agent in accordance with the flow chart illustrated in FIG. 2. By exposing the oil phase to an ultrasonic wave for 20 minutes, the silver powder agglomerated therein was dispersed. Then, the aqueous phase was stirred with a homogenizer at a rate of 3,000 rpm and, at the same time, the oil phase was gradually added dropwise to the stirred aqueous phase to produce a suspension allowing the presence of the oil phase on the surface of the silver powder. This suspension was kept at 60° C. and stirred with a three-one motor at a rate of 180 rpm for four hours. Thereafter, a microcapsule type conductive filler A having the surface of minute conductive particles (silver powder) coated with a polymer as illustrated in FIG. 3 was separated and dried at 60° C. for 30 minutes, to afford an MC type conductive filler.

Since the production of this MC type conductive filler forms the subject matter of this invention, the production of the MC type filler set forth in Example 1 above will be described more specifically below (in the following description, the amounts of part of the raw materials are different from those of the preceding paragraph).

1.1 Treatment of Fine Metallic Particles with a Coupling Agent

To ensure retention of the monomer on the surface of fine metallic particles, the following treatment with a coupling agent was carried out. In 50 ml of ethanol, 0.3 g of a titanate type coupling agent and 6 g of minute Ag/Cu particles were retained at 60° C. and subjected to ultrasonic dispersion for 10 minutes. Then, by keeping the solution at 60° C. and expelling ethanol by distillation, the treatment of the surface of minute metallic particles with the coupling agent was effected. Incidentally, the amount of coupling agent to be used must be in the range between 0.1 and 10% by weight and is preferably 5% by weight, based on the amount of the minute metallic particles. The reason for the particular range is that the surface of the minute metallic particles cannot be uniformly coated with the coupling agent if the amount is less than 0.1% by weight and the minute metallic particles cohere if the amount exceeds 10% by weight. Further, the solubility parameter of the coupling agent is desired to be within $\pm 10$ (cal/cm$^3$)$^{1/2}$ of that of the monomer to be used in the oil phase. This range is important for the purpose of improving the molecular intertwining of the coupling agent and the monomer.

1.2 Preparation of Aqueous Phase

An aqueous phase was prepared by dissolving 1.5 g of an emulsifier, 14.5 g of PVA (viscosity of the aqueous phase 20 cps), and 10 g of TEPA in 200 ml. Here, the amount of PVA to be added must be controlled so as to adjust the viscosity of the aqueous phase in the range between 1 and 1,000 cps and preclude the otherwise possible sedimentation of the minute metallic particles.

1.3 Preparation of Oil Phase

An oil phase was prepared by dissolving 10 g of BPA in 30 ml of ethyl acetate and adding 7 g of minute Ag/Cu particles to the resultant solution. The solvent to be used for the oil phase must exhibit solubility of not less than 0.1% in water. If a solvent not satisfying this condition is used, the solvent in the produced MC filler intervenes between the polymer and the minute metallic particles and, when this MC filler is used in the conductive adhesive agent, the entrapped solvent causes corrosion of the product of union. The solubility of the solvent to be used is preferably about 3% in water.

1.4 Dispersion of Minute Ag/Cu Particles

The oil phase was exposed to an ultrasonic wave for 10 minutes to effect thorough dispersion of the minute Ag/Cu particles therein. Though the minute Ag/Cu particles used in this example were spheres in shape, the coating is equally effected when these particles are pseudospheres or fish scales in shape. When the MC filler is intended for use in the MC type conductive adhesive agent, the particles in the shape of fish scales are not used advantageously because they do not serve as spacers between the bump and the pad as shown in Table 8.

1.5 Preparation of Suspension

A suspension was prepared by stirring the aqueous phase with a homogenizer at a rate of 4,000 rpm and, at the same time, adding the oil phase gradually to the stirred aqueous phase dropwise. The operating speed of the homogenizer must be in the range between 500 and 10,000 rpm. The reason for the particular range is that no homogeneous suspension is obtained if the speed is less than 500 rpm and the minute Ag/Cu particles are damaged if the speed exceeds 10,000 rpm.

1.6 Interfacial Polymerization Reaction

The suspension prepared in 1.5 above was stirred with a three-one motor at 150 rpm and heated at 60° C. to induce a reaction for four hours. The stirring must be carried out with an operational speed kept in the range between 50 and 250 rpm., which prevents sedimentation of the minute metallic particles (to which occurs if the speed is less than 50 rpm), cohesion (which occurs if the speed is larger than 250 rpm) during the interfacial polymerization reaction.

(2) Observation of Cross Section of Microcapsule Type Conductor Filler

The microcapsule type conductive filler produced as described above was buried in an epoxy resin, allowed to set therein, and cut with a microtome to expose the cross section of the filler for visual observation.

(3) Confirmation of Insulation of Microcapsule Type Conductive Filler

The filler was dispersed between two opposed glass substrates having the surface thereof coated with ITO and tested for insulation between the glass substrates.

(4) Preparation of Conductive Adhesive Agent

The microcapsule type conductive filler prepared in (1) above was mixed in a voluminal proportion of 20% with an epoxy type one-component adhesive agent. The resultant mixture was thoroughly stirred to effect dispersion of the filler therein to afford a microcapsule type conductive adhesive agent.

(5) Bonding of Chip to Substrate

Figure 4:
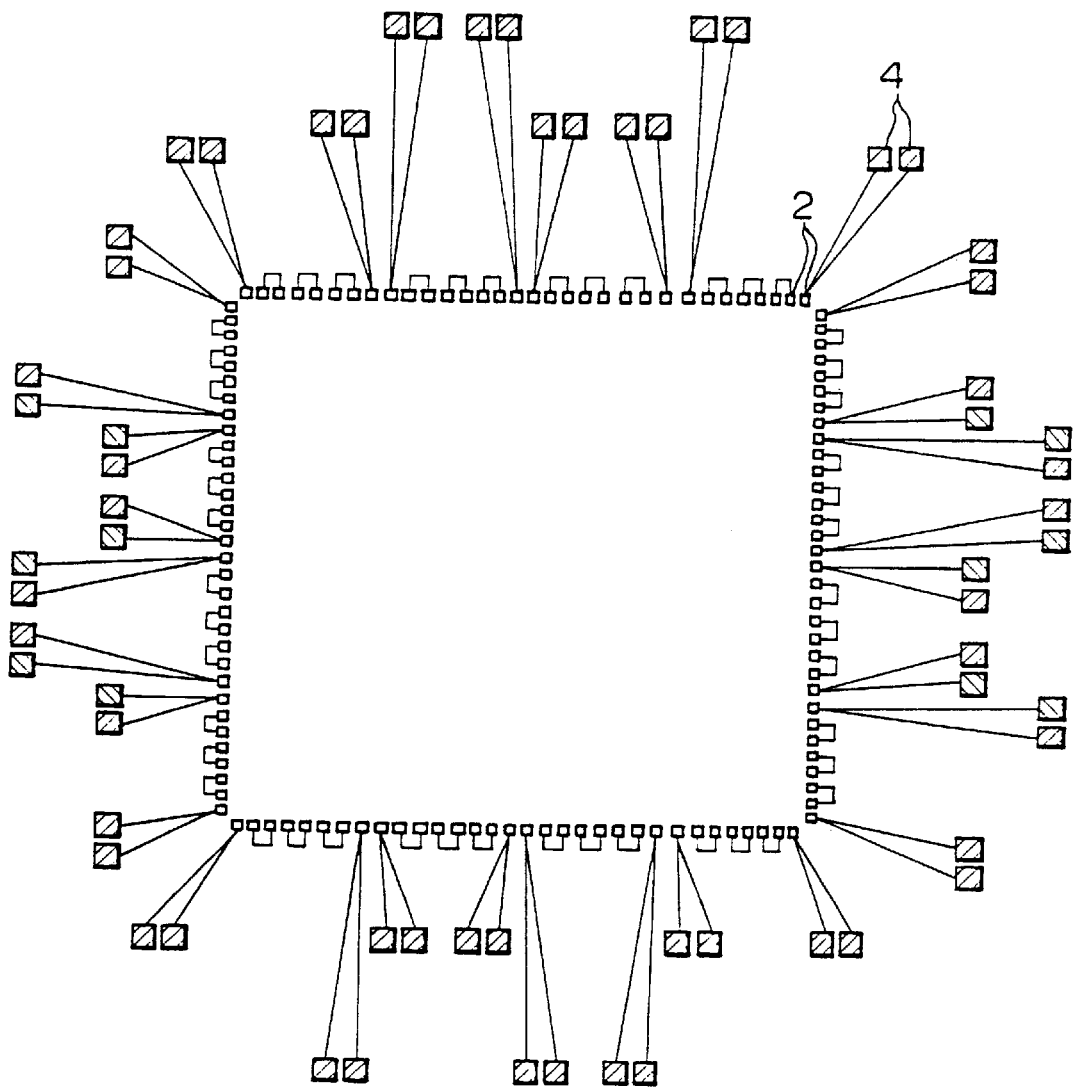
FIG. 4 is a type diagram illustrating one example of a substrate.
Figure 5:
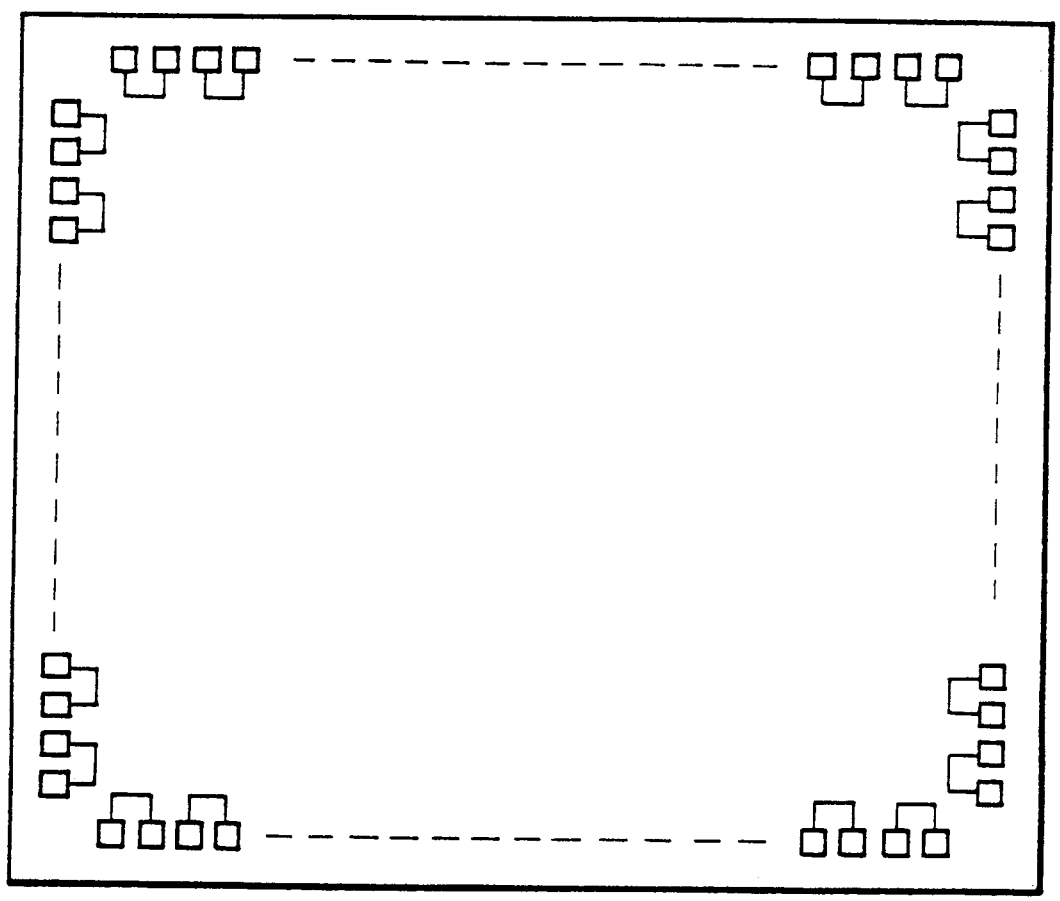
FIG. 5 is a type diagram illustrating one example of a glass chip.

A 40 $\mu$m conductive adhesive agent prepared in (2) above was uniformly applied to a substrate (number of pads 128, interval between pads 100 $\mu$m, and size pad 200 $\mu$m □) illustrated in FIG. 4. The substrate and a glass chip (128 pins) illustrated in FIG. 5 to which the substrate was tacked by bumping were subjected to thermocompression bonding at a temperature of 170° C., 30 sec, and 35 g/bump. In the diagram of FIG. 4, 2 represents an electrode and 4 represents an electrode to be used for such evaluations as a test for electric continuity.

(6) Test for Electric Continuity and Test for Insulation

Figure 6:
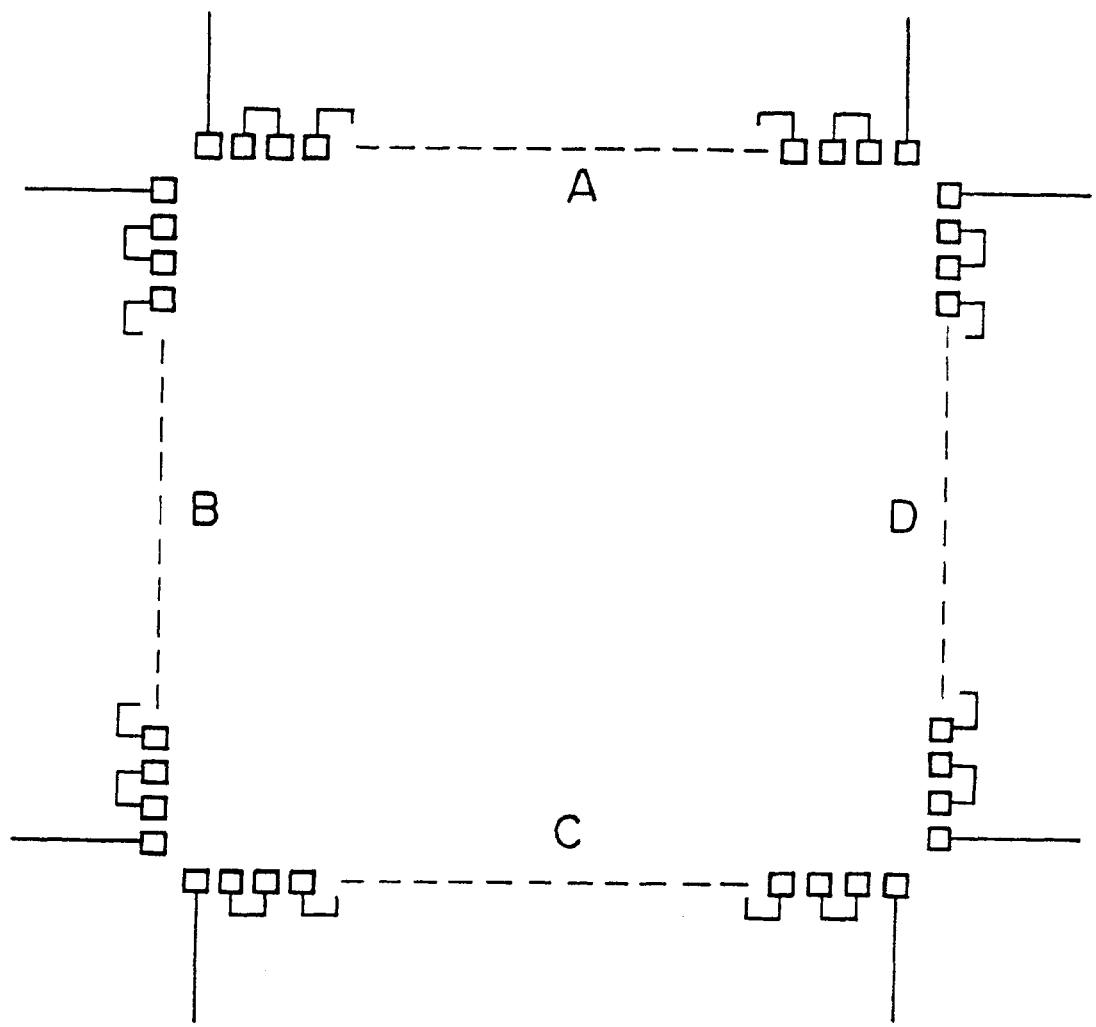
FIG. 6 is a type diagram illustrating sites for determination of electric continuity resistance and insulation resistance.
Figure 7:
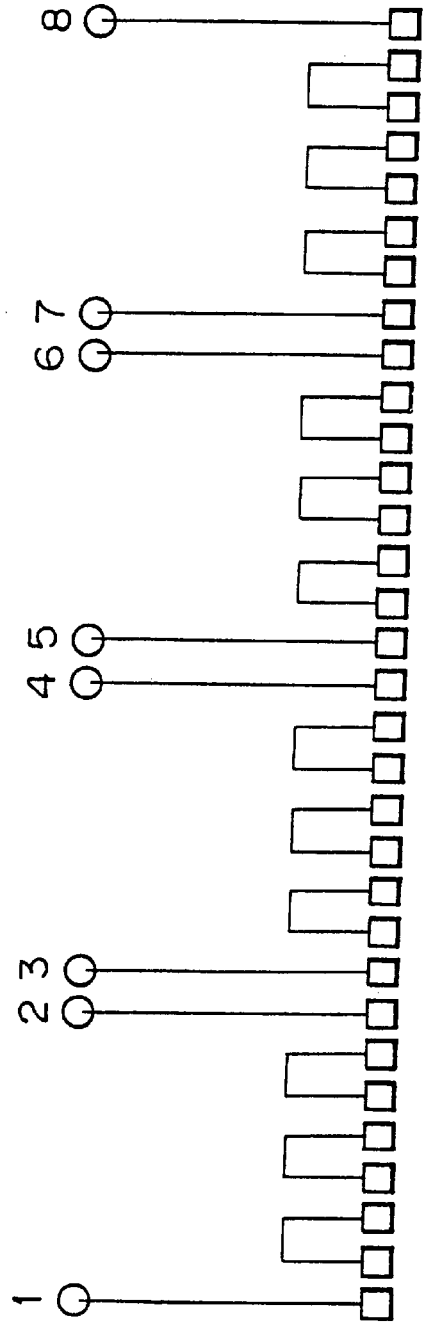
FIG. 7 is a partially magnified diagram of FIG. 6.

The product of union obtained by bonding in (3) above was tested for electric continuity by the four-terminal method using the sites of measurement illustrated in FIG. 6 and FIG. 7 and was tested for insulation by using a high-resistance meter (insulation resistance meter).

Incidentally, the measurement of electric continuity was made at circuit 1, circuit 2, circuit 3, and circuit 4 and that of insulation resistance at insulation part 1, insulation part 2, and insulation part 3 as illustrated in FIG. 7.

(7) Observation of State of Adhesion of Chip to Substrate

The product of union obtained by bonding in (3) above was sectioned and the cross section consequently exposed was visually examined to determine the state of adhesion of the filler to the chip and the substrate.

(Results)

(1) Observation of Cross Section of Microcapsule Type Conductive Filler

Figure 8:
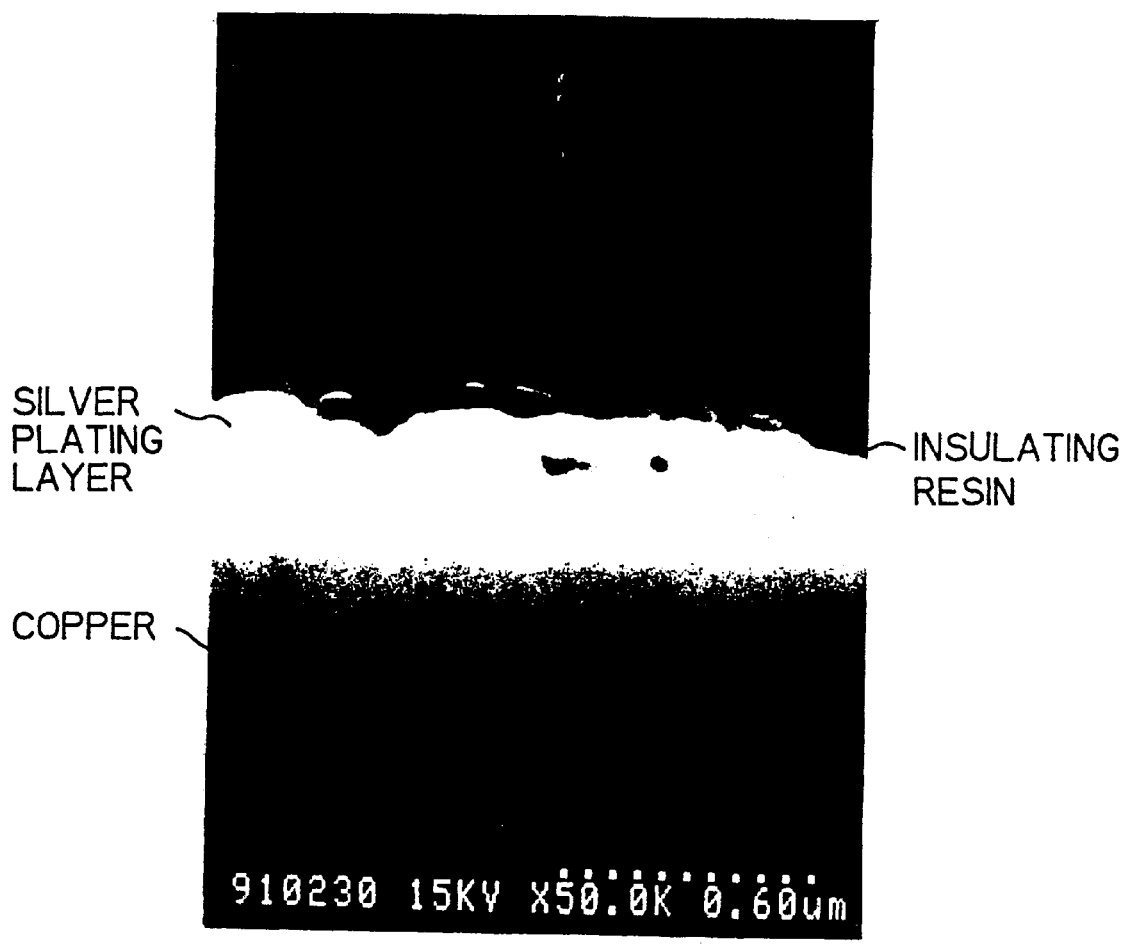
FIG. 8 is a photomicrograph of the microcapsule type conductive filler (15,000 magnifications)

FIG. 8 is a photograph of a cross section of the microcapsule type conductive filler. It is clearly noted from the photograph that an insulating polymer was present on the surface of a minute conductive particle, indicating that the particle was completely coated.

(2) Confirmation of Insulation with Microcapsule Type Conductive Filler

The two opposed glass substrates were found to be insulated from each other, indicating that the microcapsule type conductive filler served to effect insulation.

(3) Measurement of Electric Continuity

The results of the test for electric continuity are shown in Table 1. All the circuits used for the test invariably showed highly satisfactory results of electric continuity not exceeding 1.5 $\Omega$ (not more than 0.2 $\Omega$ per joint).

Figure 10:
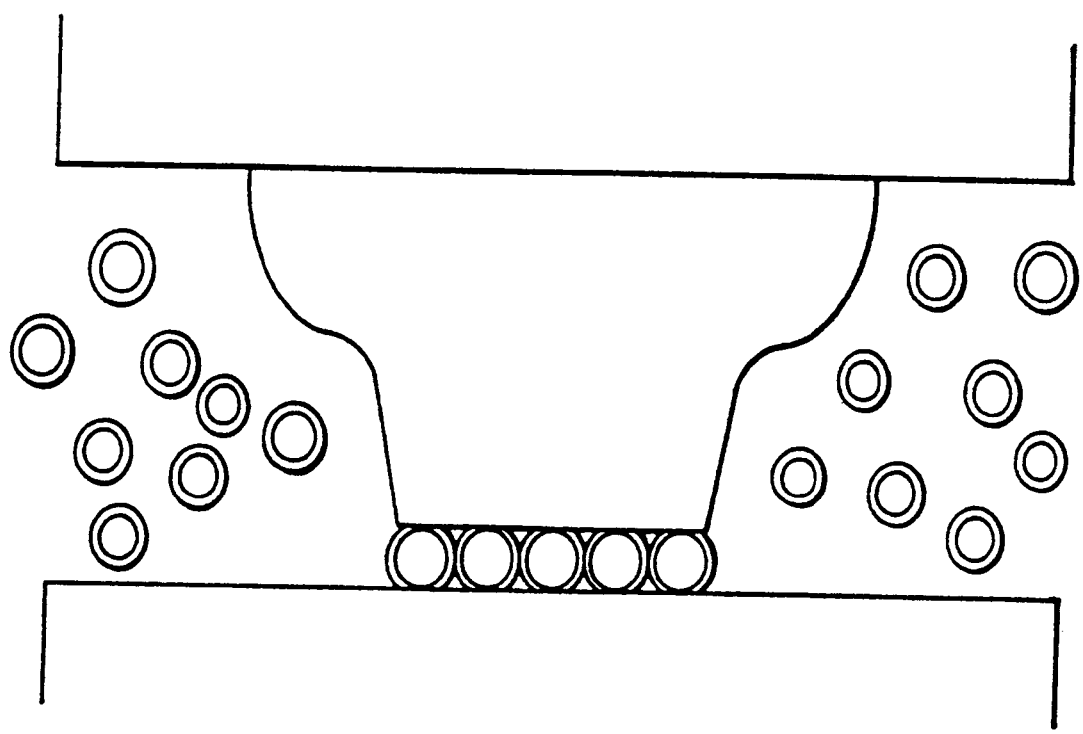
FIG. 10 is a type diagram illustrating the state of union between a chip and a substrate.

To be specific, the chip and the substrate were joined as illustrated in FIG. 10 and the electric continuity resistance was not more than 0.2 $\Omega$ per joint and, in spite of the high filler content of 20% by volume, the adjacent patterns showed highly satisfactory insulation in the order of $1\times10^{11}$ $\Omega$.

TABLE 1

| | Electric continuity resistance | | | |
|---|---|---|---|---|
| Side of measurement | Circuit 1 | Circuit 2 | Circuit 3 | Circuit 4 |
| A | 1.1034 | 1.1298 | 1.0865 | 1.2051 |
| B | 1.1298 | 1.2114 | 1.1695 | 1.1326 |
| C | 1.2365 | 1.1511 | 1.1233 | 1.1519 |
| D | 1.2562 | 1.1145 | 1.2314 | 1.1413 |

In: $\Omega$ (4) Measurement of Insulation Resistance

Table 2 shows the results of the test for insulation resistance. Even though the amount of filler incorporated was as large as 20% by volume (substantially equal to the amount of silver paste for a die bond), the adjacent patterns displayed highly satisfactory insulation of not less than $10^{11}$ $\Omega$.

TABLE 2

| | Insulation resistance | | |
|---|---|---|---|
| Side of measurement | Insulation 1 | Insulation 2 | Insulation 3 |
| A | 3.6 | 2.5 | 2.8 |
| B | 2.1 | 2.6 | 3.0 |
| C | 1.5 | 2.7 | 3.0 |
| D | 1.8 | 2.0 | 3.0 |

In: $10^{11}$ $\Omega$ (5) Observation of State of Union Between Chip and Substrate (bump and pad)

Figure 9:
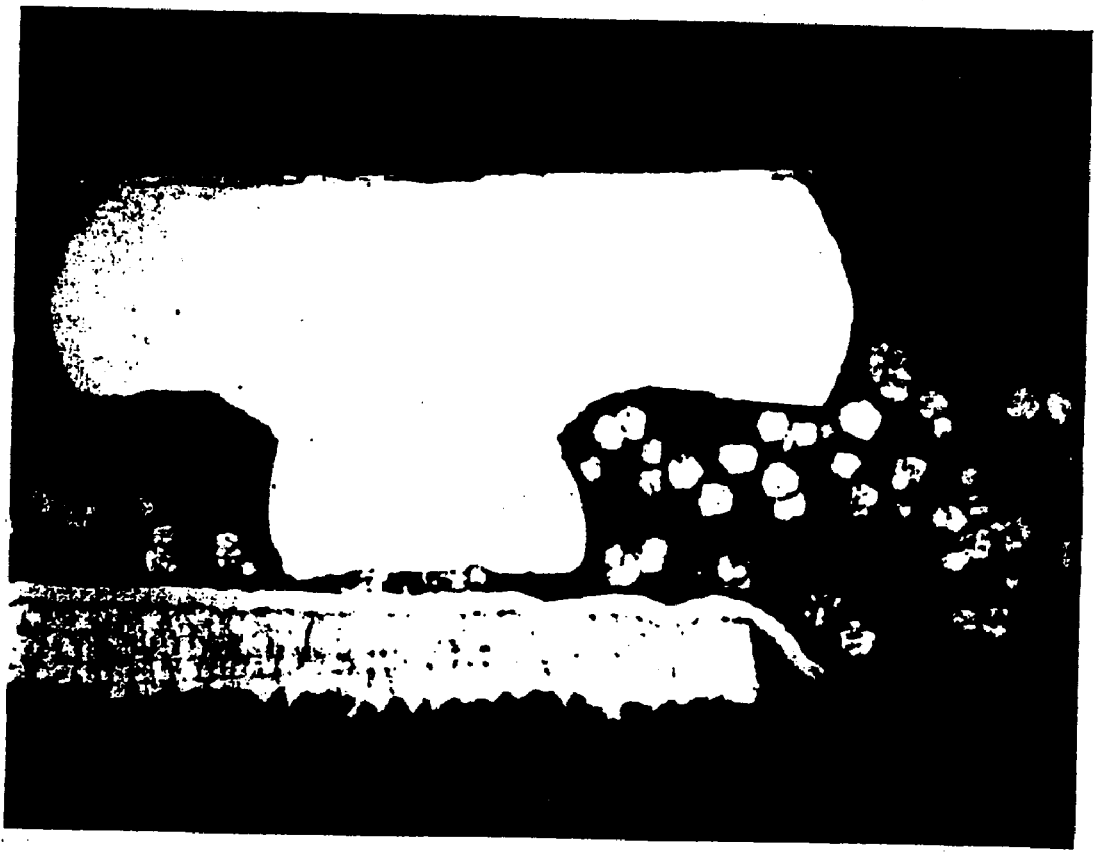
FIG. 9 is a photomicrograph of a part of union between a bump and a pad (504 magnifications)

FIG. 9 is a photograph showing a cross section of the joint between the bump and the pad. It is clearly noted from this photograph that the microcapsule type conductive filler was amply present between the bump and the pad.

EXAMPLE 2

A microcapsule type conductive filler was produced by faithfully following the procedure of Example 1, except that minute Ag particles (average diameter 0.1 μm) were used instead as minute conductive particles. It was evaluated in the same manner as in Example 1.

(Results)

(1) Observation of Cross Section of Microcapsule Type Conductive Filler

Similarly to the filler illustrated in FIG. 8, an insulating polymer was found to have uniformly coated the surface of agglomerated minute conductive particles.

(2) Confirmation of Insulation with Microcapsule Type Conductive Filler

The filler showed the same degree of insulation as found in Example 1.

(3) Measurement of Electric Continuity Resistance

The electric continuity resistance was substantially the same as in Example 1.

(4) Measurement of Insulation Resistance

The insulation resistance was substantially the same as in Example 1.

(5) Observation of State of Union Between Chip and Substrate (bump and pad)

Similarly to the product of union illustrated in FIG. 9, the microcapsule type conductive filler was amply present between the pad and the bump.

EXAMPLE 3

Microcapsule type conductive filler and adhesive agent were produced by faithfully following the procedure of Example 1, except that 10 g of bismaleimide (BMI) and 0.1 g of diazobicycloundecene were used in place of the monomer BPA. They were evaluated in the same manner as in Example 1.

(Results)

(1) Observation of Cross Section of Microcapsule Type Conductive Filler

Similarly to the product of union illustrated in FIG. 8, an insulating polymer was found to have coated minute conductive particles completely.

(2) Confirmation of Insulation with Microcapsule Type Conductive Filler

The filler showed the same degree of insulation as in Example 1.

(3) Measurement of Electric Continuity Resistance

The filler showed the same degree of electric continuity resistance as in Example 1.

(4) Measurement of Insulation Resistance

The filler showed the same degree of insulation resistance as in Example 1.

(5) Observation of State of Union Between Chip and Substrate (bump and pad)

The state of union was the same as that found in Example 1.

COMPARATIVE EXAMPLE 1

(1) Preparation of Microcapsule Type Conductive Filler

A microcapsule type conductive filler was produced by the coating method described below using the following materials.

Minute conductive particles: 30 g of minute Ag/Cu particles (same as those of Example 1)

Polymer: PMMA (average particle diameter 0.15 μm) (m.p. 135° C.)

A microcapsule type conductive filler coated with PMMA was produced by dissolving 5 g of PMMA in 100 ml of xylene, spraying the resultant solution into minute conductive particles, and drying the particles (for expulsion of xylene).

(2) Observation of cross section of microcapsule type conductive filler (3) Confirmation of insulation with microcapsule type conductive filler (4) Preparation of conductive adhesive agent (5) Bonding of chip to substrate (6) Test for electric continuity and test for insulation (7) Observation of state of union between bump and pad The operations of (2) to (7) indicated above were carried out in the same manner under the same conditions as those of (2) to (7) of Example 1.

(Results)

(1) Observation of Cross Section of Microcapsule Type Conductive Filler

Similarly to the minute conductive particles of (7), Example 1 illustrated in FIG. 8, the filler particles were found to be completely coated with PMMA.

(2) Confirmation of Insulation with Microcapsule Type Conductive Filler

Similarly to the filler of Example 1, the microcapsule type conductive filler retained insulation.

(3) Measurement of Electric Continuity Resistance

All the circuits, similarly to those of Example 1, showed highly satisfactory electric continuity resistance of not more than 1.5 Ω.

(4) Measurement of Insulation Resistance

Table 3 shows the results of the measurement. Of the total of 12 insulation parts, two insulation parts showed electric continuity, probably because the bonding was made at a temperature of 200° C. and the PMMA was consequently decomposed or fused to establish contact between the minute conductive particles.

TABLE 3

| Side of measurement | Insulation resistance | | |
| --- | --- | --- | --- |
| | Insulation 1 | Insulation 2 | Insulation 3 |
| A | 1.5 | $2.5 \times 10^{11}$ | 510 |
| B | $2.1 \times 10^{11}$ | 8 | 150 |
| C | 20 | $2.7 \times 10^{11}$ | 26 |
| D | 35 | 10 | $3.0 \times 10^{11}$ |

In: Ω

(5) State of Union Between Bump and Pad

Similarly to the results of (5) in Example 1, the microcapsule type conductive filler was amply present between the bump and the pad.

COMPARATIVE EXAMPLE 2

Preparation of Microcapsule Type Conductive Filler

A microcapsule type conductive filler was produced by faithfully following the procedure of Example, except that Cu particles 60 μm in diameter were used as minute conductive particles.

The produced microcapsule type conductive filler was evaluated in the same manner under the same conditions as described in (2) to (7) of Example 1.

(Results)

The produced filler having the surface thereof completely coated with a polymer showed insulation. The electric continuity resistance and the state of union between the bump and the pad were equal to those obtained in Example 1. No insulation was retained between the adjacent pads.

COMPARATIVE EXAMPLE 3

A microcapsule type conductive filler produced by following the procedure of Example 1 was mixed with an epoxy type adhesive agent having a viscosity of 210,000 cps.

(Results)

The filler could not be dispersed in the adhesive agent because the viscosity of the adhesive agent was unduly high.

EXAMPLE 4

The use of two kinds of monomers, a thermosetting resin, and a solvent was omitted and a monomer were used in both the oil phase and the aqueous phase.

Figure 2:
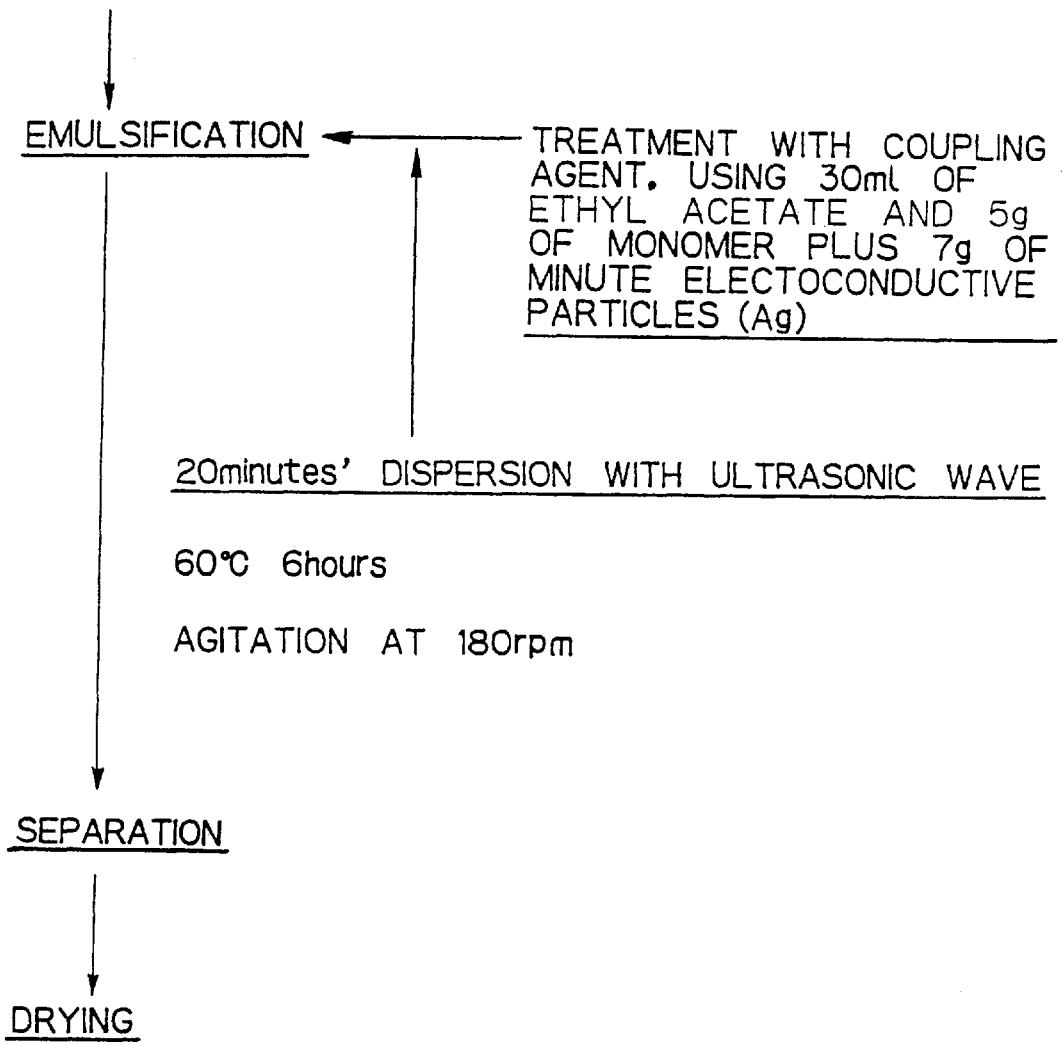
FIG. 2 is a flow sheet of the production of a microcapsule type conductive filler.
Figure 3:
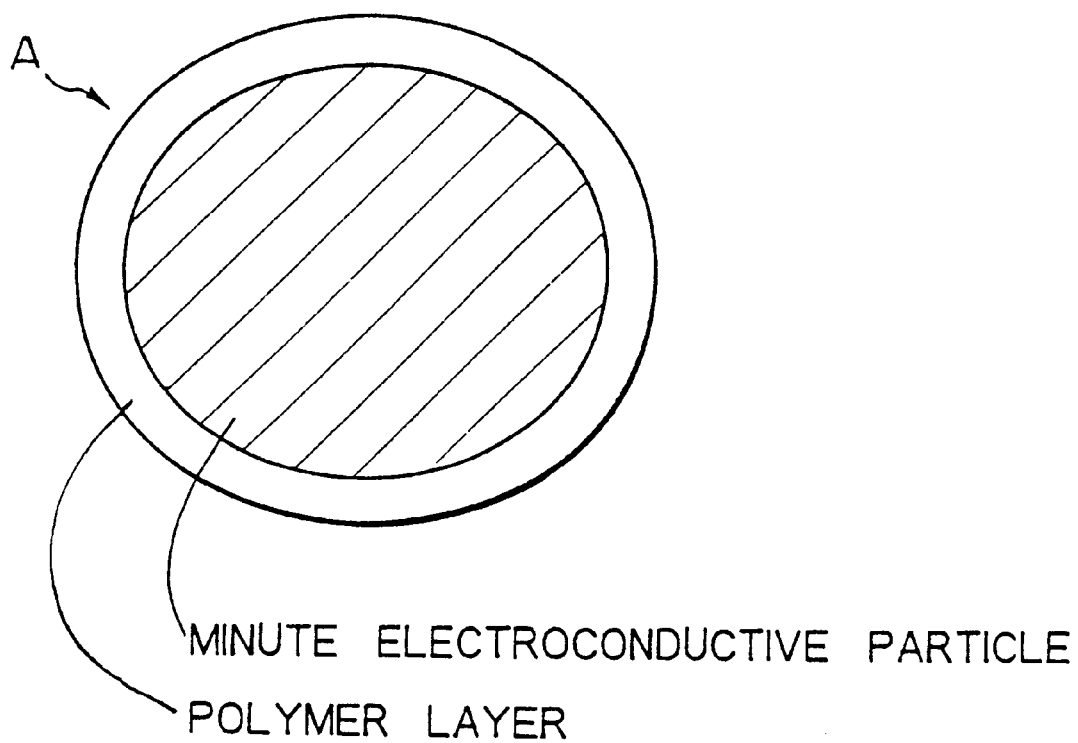
FIG. 3 is a type diagram of the microcapsule type conductive filler.

A microcapsule type conductive filler and a microcapsule type conductive adhesive agent were produced by faithfully following the procedure of Example 1, except that an oil phase obtained by dispersing 7 g of conductive particles treated with a coupling agent in 10 g of BPA in accordance with the flow sheet shown in FIG. 2 was used dichloroethane instead of ethyl acetate solvent in the oil phase. They were evaluated in the same manner as in Example 1.

(Results)

In all the items of evaluation, the results were equal to those obtained in Example 1.

EXAMPLE 5

One kind of monomer was used and a thermosetting resin and a solvent were used, and one kind of monomer was used in the oil phase.

A microcapsule type conductive filler and a microcapsule type conductive adhesive agent were produced by following the procedure of Example 1, except that an aqueous phase was prepared by dissolving 12 g of polyvinyl alcohol and 1.5 g of an emulsifier in 200 ml of water and a solution of 10 g of divinyl benzene and 0.1 g of benzoyl peroxide in 15 ml of ethyl acetate was used as an oil phase.

(Results)

In all the items of evaluation, the results were almost the same as those obtained in Example 1.

EXAMPLE 6

Two kinds of monomers were used, including a thermosetting resin and a solvent, and two kinds of monomers were used in the oil phase.

A microcapsule type conductive filler and a microcapsule type conductive adhesive agent were produced by following the procedure of Example 1, except that an aqueous phase was prepared by dissolving 12 g of polyvinyl alcohol and 1.5 g of an emulsifier in 200 ml of water and an oil phase was prepared with 15 ml of ethyl acetate and 5 g of imidazole. They were evaluated in the same manner as in Example 1.

(Results)

In all the items of evaluation, the results were nearly the same as those obtained in Example 1.

EXAMPLE 7

Two kinds of monomers and a thermosetting resin were used only in the oil phase and no solvent was used.

An MC filler and an MC conductive adhesive agent were produced by faithfully following the procedure of Example 6, except that the use of ethyl acetate was omitted. They were evaluated in the same manner as in Example 6.

(Results)

In all the items of evaluation, the results were nearly the same as those obtained in Example 1.

EXAMPLE 8

One kind of monomer and a thermosetting resin were used and no solvent was used. The monomer was used in the oil phase.

A microcapsule type conductive filler and a microcapsule type conductive adhesive agent were produced by following the procedure of Example 2, except that an aqueous phase was prepared by dissolving 12 g of polyvinyl alcohol and an emulsifier in 200 ml of water and an oil phase was prepared by dispersing in 10 g of divinyl benzene 0.1 g of benzoyl peroxide and 7 g of minute conductive particles treated with a coupling agent in accordance with the flow sheet illustrated in FIG. 2 without using ethyl acetate (solvent). They were evaluated in the same manner as in Example 2.

(Results)

In all the items of evaluation, the results were nearly the same as those obtained in Example 1.

EXAMPLE 9

A blend of a thermoplastic resin and a thermosetting resin and a solvent were used. The monomer was used in the oil phase.

A microcapsule type conductive filler and a microcapsule type conductive adhesive agent were produced by following the procedure of Example 1, except that 5 g of methyl methacrylate, 5 g of bismaleimide, and 0.1 g of azoisobutyronitrile were used as monomers in place of BPA and TEPA. They were evaluated in the same manner as in Example 1.

(Results)

In all the items of evaluation, the results were nearly the same as those obtained in Example 1.

EXAMPLE 10

A blend of a thermoplastic resin and a thermosetting resin and a solvent were used. The monomer was used in the oil phase and the aqueous phase.

A microcapsule type conductive filler and a microcapsule type conductive adhesive agent were produced by following the procedure of Example 1, except that an aqueous solution was prepared by dissolving 12 g of polyvinyl alcohol, 1.5 g of an emulsifier, and 15 g of hexamethylene diamine in 200 ml of water and a solution of 7 g of adipic acid and 7 g of BPA in 15 ml of ethyl acetate was used as an oil phase. They were evaluated in the same manner as in Example 1.

(Results)

In all the items of evaluation, the results were nearly the same as those obtained in Example 1.

EXAMPLE 11

A blend of monomers was used in the oil phase and no solvent was used.

An MC filler and an MC type conductive adhesive agent were produced by following the procedure of Example 10, except that ethyl acetate was omitted. They were evaluated in the same manner as Example 10.

(Results)

In all the items of evaluation, the results were nearly the same as those obtained in Example 1.

EXAMPLE 12

A blend of monomers was used in the oil phase and the aqueous phase and no solvent was used.

An MC type filler and an MC type conductive adhesive agent were produced by following the procedure of Example 11, except that ethyl acetate was omitted. They were evaluated in the same manner as in Example 11.

(Results)

In all the items of evaluation, the results were nearly the same as those obtained in Example 1.

EXAMPLE 13

An MC type filler produced by the procedure of Example 1 was tested for the following items.

(1) Effect of sp (solubility parameter) Value of Coupling Agent on Production of MC Type Filler Table 4 shows the results of the test performed on MC fillers prepared using coupling agents of different sp values with respect to electric continuity.

TABLE 4

Results of test of MC type filler for insulation

| Difference of sp values of coupling agent and monomer | Results of test for insulation |
|---|---|
| 0 | Insulation |
| 5 | Insulation |
| 10 | Insulation |
| 11 | Electric continuity |

The results indicate that the difference between the sp value of the monomer (epoxy resin) and the sp value of the coupling agent must be within 10 $(cal/cm^3)^{1/2}$. The possible reason for this limit is that the monomer molecules and the coupling agent molecules are intertwined with difficulty and retention of the monomer on the surface of the minute conductive particles is not attained. Incidentally, the sp value of the epoxy resin is 10.9 $(cal/cm^3)^{1/2}$.

(2) Effect of Viscosity of Aqueous Phase on Stability of Suspension

Table 5 shows the results of the test performed involving the effect of changes in the viscosity of the aqueous phase on the stability of the suspension.

TABLE 5

Relation between viscosity of aqueous phase and suspension

| Viscosity of aqueous phase (cps) | 10 | 20 | 100 | 1000 | 10000 | 11,000 |
|---|---|---|---|---|---|---|
| Stability of suspension | Sedimentation of minute conductive particles observed | Stable | Stable | Stable | Stable | Suspension not producible and separation of MC filler after reaction not effectible |

The results indicate that the viscosity of the aqueous solution is proper in the range between 20 and 10,000 cps.

(3) Effect of Stirring Speed on Stability of Suspension

Table 6 shows the results of the test performed involving the effect of the stirring speed (30, 50, 250, and 300 rpm) on the stability of the suspension.

TABLE 6

Relation of speed of stirring and stability of suspension

| Speed of stirring | 30 | 50 | 250 | 300 |
|---|---|---|---|---|
| Stability of suspension | Sedimentation of minute conductive particles observed | Stable | Stable | Adhesion of minute conductive particles to beaker wall observed |

The results indicate that the stirring must be carried out at a rate in a range between 50 and 250 rpm.

(4) Relation of Particle Diameter and Insulation Resistance of Minute Conductive Particles Table 7 shows the results of the test performed on minute conductive particles of diameters 10, 30, 50, and 70 μm for insulation.

TABLE 7

Relation between particle diameter and insulating property of coated minute conductive particles

| Particle diameter (μm) of minute conductive particles | Results of test for insulation |
|---|---|
| 10 | Insulation |
| 30 | Insulation |
| 50 | Insulation |
| 70 | Electric continuity |

The results indicate that the minute conductive particles to be used should have a diameter of not more than 50 μm.

(5) Relation Between Shape and Electric Continuity Resistance of Minute Conductive Particles.

Table 8 shows the results of the test performed on minute conductive particles having different shapes of spheres, pseudospheres, and fish scales with respect to electric continuity.

TABLE 8

Relation between shape and conductivity of minute conductive particles

| Shape of minute conductive particles | Conductivity (Number of defective portions/number of sites of measurement) |
|---|---|
| Spheres | 0/100 |
| Pseudospheres | 0/100 |

TABLE 8-continued

Relation between shape and
conductivity of minute conductive particles

| Shape of minute conductive particles | Conductivity (Number of defective portions/number of sites of measurement) |
|---|---|
| Fish scales | 23/100 |

In the case of a filler using minute particles of the shape of fish scales, the surface completely coated with a polymer, the insulation was satisfactory, and the adjacent pads were insulated from each other. Absolutely no electric continuity was established. Though the filler was present between the bump and the pad, it failed to serve as a medium for union thereof. The results indicate that the minute conductive particles should be in the shape of either spheres or pseudospheres.

(6) Relation Between Thickness and Electric Continuity Resistance of an Insulating Resin Layer Table 9 shows the results of the test performed on insulating resin layers formed of the MC type conductive filler with different thicknesses with respect to electric continuity.

TABLE 9

Relation between thickness and
conductivity of insulating resin

| Thickness ($\mu$m) of insulating resin | Resistance per site of measurement ($\Omega$) |
|---|---|
| 0.1 | 0.1 |
| 2.0 | 0.4 |
| 3.0 | 0.5 |
| 4.0 | 1.5 |

It is noted from Table 9 that the resistance to electric continuity was high and points of poor electric continuity were detected when the thickness of the insulating resin layer (coating layer) was 4.0 $\mu$m. The results indicate that the thickness of the insulating resin layer is desired to be not more than 3 $\mu$m.

(7) Content of MC Type Filler

Table 10 shows the relation between the MC type filler and the state of curing of the adhesive agent.

TABLE 10

Content of MC type conductive
filler and state of adhesive agent

| Content (%) | 1 | 10 | 30 | 50 | 55 | 65 | 70 |
|---|---|---|---|---|---|---|---|
| State of curing | Good | Good | Good | Good | Good | Poor adhesion | Poor adhesion |

Poor adhesion: Complete wetting of filler with adhesive agent not obtained because of excess amount of filler.

The results indicate that the content of the MC type conductive filler must not be more than 60% by volume. Now, the third and fourth aspects of this invention will be described specifically below with reference to Examples 14 to 16.

EXAMPLE 14

An MC type conductive adhesive agent was produced with the following materials.

Minute conductive particles: Minute Cu pseudospheres having the surface plated with Ag (Ag/Cu, average particle diameter 5 $\mu$m).

Adhesive agent: A composition consisting of an epoxy resin as the main component and an acid anhydride as the curing agent).

Affinity agent: Triazine thiol (RTD).

Monomer: Bisphenol A type epoxy resin (BPA) (produced by Shell and marketed under trademark designation of "Epikote 828").

(1) Method for Production of MC Type Conductive Filler

Figure 11:
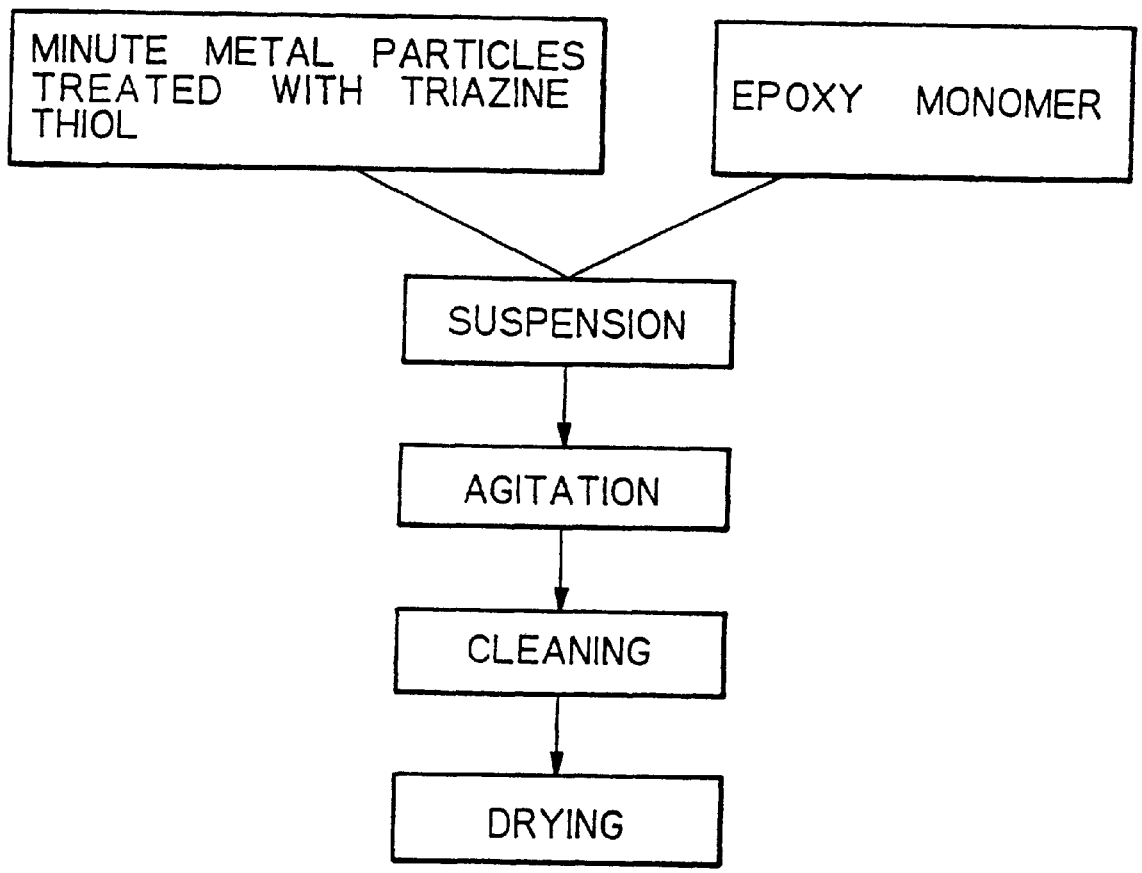
FIG. 11 is a flow sheet of the production of a microcapsule type conductive filler as the second aspect of this invention.

The minute metallic particles were subjected to a surface treatment. First, the minute metallic particles were washed with an acid and then with an alkali, and pretreated with Triclene to defat and clean the surface thereof. The cleaned minute metallic particles were immersed in a triazine thiol solution to be coated with a film of triazine thiol. This solution was prepared by dissolving triazine thiol in acetone in a concentration of $10^{-4}$ mol/lit. No uniform film is obtained if the concentration is lower than this level and the speed of treatment is too high to be controlled as required if the concentration exceeds $10^{-3}$ mol/l. The temperature of this treatment is not lower than 17° C. It is desired to be in the range of 20±3° C. because the speed of the treatment is too high to be controlled as desired if the temperature is unduly high. The time of treatment is desired to be in the range of 30±5 minutes in due consideration of the relation between the concentration mentioned above and the temperature. It goes without saying that for such conditions as concentration, temperature, and time of the treatment, the magnitudes thereof to be selected should be optimum for obtaining a film having a suitable thickness and a suitable constitution depending on the purpose or use thereof. Then, the minute metallic particles were washed with the solvent used and methanol and the wet minute metallic particles were dried to complete the surface treatment. In a solution of 10 g of epoxy monomer (BPA) in 15 ml of ethyl acetate, 10 g of the surface-treated minute metallic particles were stirred with a homogenizer at 150 rpm as illustrated in FIG. 11 to form a suspension and induce a reaction to effect the coating of the surface of Ag/Cu particles with an insulating resin layer.

Here, the principle of the production of the MC type conductive filler will be described below.

When a suspension is formed by dispersing minute metallic particles in a solution of triazine thiol in an organic solvent, this triazine thiol reacts with the OH⁻ group on the surface of the metallic particles to form a relevant salt. As a result, the surface of the minute metallic particles is coated with a triazine thiol film. When a suspension is formed by dispersing the minute metallic particles treated will triazine thiol in a solution of the monomer, the surface of the minute metallic particles undergoes a reaction. Consequently an MC type conductive filler having the surface of minute metallic particles coated with the polymer is obtained.

Now, the reaction mechanism involved herein will be described below.

The triazine thiol is a compound having a structural formula I shown below.

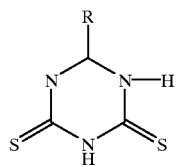

(wherein R stands for a group represented by —SH, —N(CH$_3$)$_2$, —NHC$_6$H$_5$, —N(C$_4$H$_9$)$_2$, —N(C$_8$H$_{17}$)$_2$, —N(C$_{12}$H$_{25}$)$_2$, —N(CH$_2$CH=CH$_2$)$_2$, —NHC$_8$H$_{16}$CH=CHC$_8$H$_{17}$, —NCH$_2$C$_6$H$_4$CH=CH$_2$(C$_8$H$_{17}$), or —NHC$_6$H$_4$).

Figure 12:
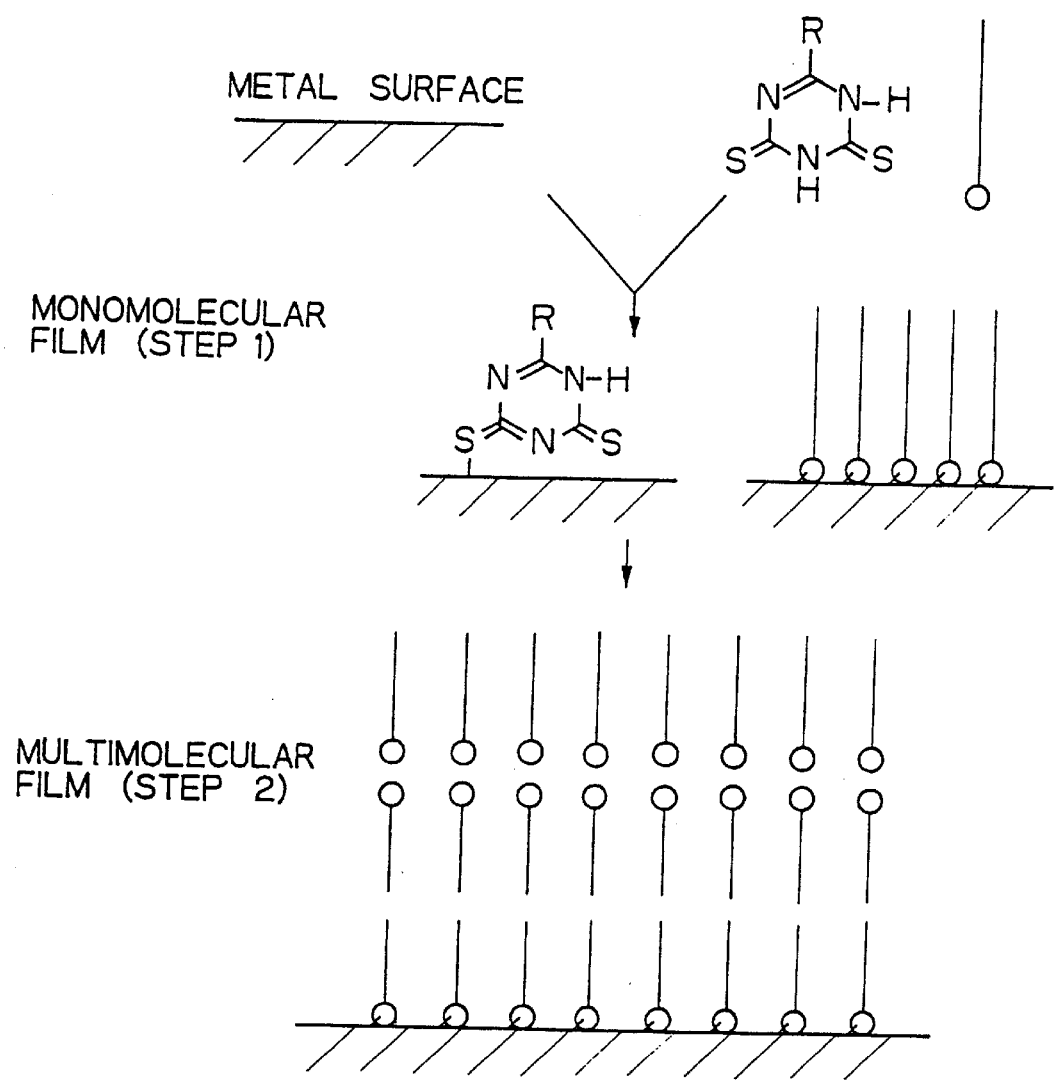
FIG. 12 is a type diagram illustrating a growth model of a triazine thiol film on the surface of metal.
Figure 13:
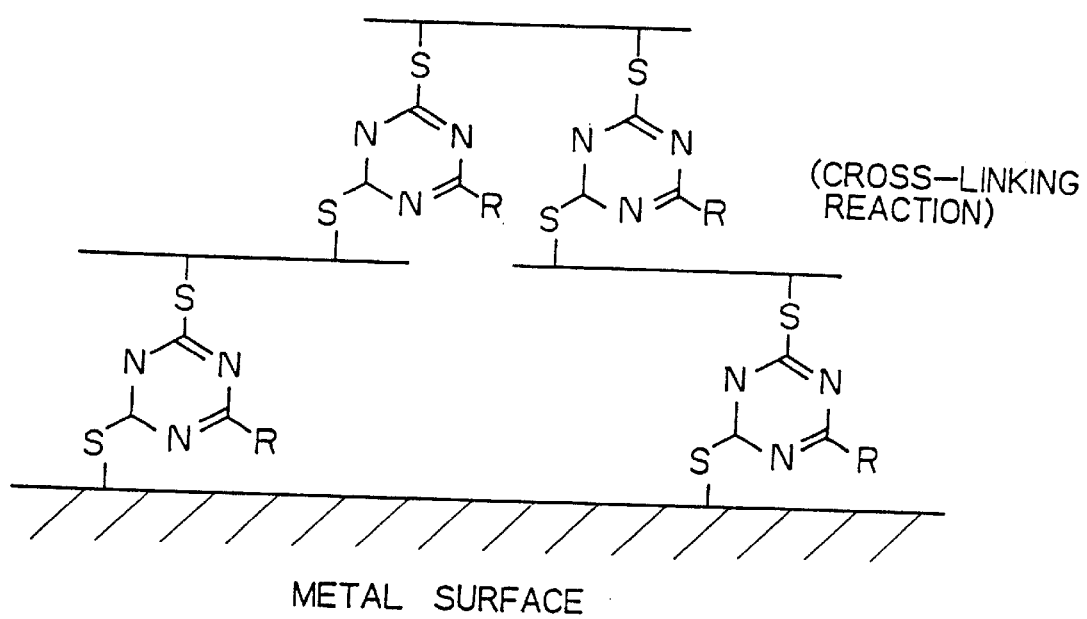
FIG. 13 is a type diagram illustrating the reaction mechanism of an epoxy monomer with triazine thiol.

When the minute metallic particles are subjected to a surface treatment with this triazine thiol, there ensues a reaction path in which a monomolecular film of triazine thiol is formed on the surface of the minute metallic particles in the first step and the monomolecular film develops into a polymolecular film in the second step as illustrated in FIG. 12, with the result that the surface of the minute metallic particles will be coated with the triazine thiol film. When the minute metallic particles that have undergone the surface treatment are mixed with an epoxy monomer, the triazine thiol acts as a cross-linking agent for the epoxy monomer to undergo a reaction illustrated in FIG. 13 and gives rise to a cured product of epoxy. Consequently, an MC type conductive filler having a surface of the minute metallic particles coated with the epoxy resin is obtained.

Here, it is necessary to pay attention to the following points.

(1) The production of the triazine thiol film must be carried out in an atmosphere of nitrogen. (2) The triazine thiol concentration must be not more than $10^{-3}$ mol/liter. (3) The reaction of the monomer must be carried out with the suspension stirred at a rate in the range between 50 and 250 rpm. The reason for (1) is that the minute metallic particles readily undergo corrosion in the presence of air because they have a large surface area. The reason for (2) is that the concentration of RTD (triazine thiol) must be kept below $10^{-3}$ mol/liter because the amount of film is calculated from the amount of unreacted RTD. The reason for (3) is that the minute metallic particles settle and agglomerate during the reaction of the monomer when stirring is omitted.

(2) Observation of Cross Section of Capsule Type Minute Metallic Particles

The produced filler was embedded in the epoxy resin, allowed to cure, and cut with a microtome to expose a cross section of the capsule type minute metallic particle to visual observation.

(3) Confirmation of Insulation with Capsule Type Minute Metallic Particles

The produced MC type conductive filler was agglomerated into a cohering mass and tested for insulation resistance with an insulation resistance meter used at freely selected points of measurement.

(4) Production of Conductive Adhesive Agent

An MC type conductive adhesive agent was produced by mixing an MC type conductive adhesive agent with 20% by volume of the MC type conductive filler prepared in (1) above. The results of the test indicate the viscosity of the produced adhesive agent was so high as to jeopardize the workability if the voluminal proportion exceeded 20%, the produced adhesive agent was barely usable if the voluminal proportion was up to 60% of the MC type conductive filler, and the adhesive agent included parts allowing no electric continuity if the voluminal proportion was unduly small.

Thus, the optimum content of the MC type filler is fixed at 20% by volume. Here, the adhesive agent used herein was a one-component type for facilitating the process of production.

(5) Union of Chip and Substrate

A substrate illustrated in FIG. 4 to which the conductive adhesive agent produced in (4) above was applied and a glass chip (128 pins, 300 μm pitch, and electrode interval 100 μm) illustrated in FIG. 6 on which stud bumps were formed were subjected to thermocompression bonding at 175° C., 30 s, and 20 g/bump.

(6) Test for Electric Continuity and Test for Insulation

Samples of the product of union indicated in (5) above were tested for electric continuity resistance by the four-terminal method using the points of measurement illustrated in FIG. 6 and FIG. 7 and tested for resistance with a resistance meter.

(Results)

(1) Observation of Cross Section of Microcapsule Type Conductive Filler

The condition of the surface of minute conductive particles coated uniformly with an insulating resin as illustrated by a type diagram of FIG. 3 was confirmed.

(2) Insulation Resistance of Microcapsule Type Conductive Filler

The magnitudes of insulation measured at all the points invariably exceeded a high level of $1 \times 10^{11}$ Ω.

(3) Measurement of Electric Continuity Resistance and Insulation Resistance Between Bonded Chip and Substrate The union between the chip and the substrate was obtained as illustrated by a type diagram in FIG. 10. The magnitudes of electric continuity resistance were satisfactory, invariably falling below 0.2 Ω per point of contact. Though the filler was incorporated in such a large proportion as 20% by volume, highly satisfactory insulation of $1 \times 10^{11}$ Ω was found between the adjacent patterns.

This example represents one case of using tiazine thiol as an affinity agent. This invention is not limited to this particular affinity agent. Naturally, any compound possessing a reactive group that exhibits affinity for both the metal and the monomer intended to coat the metal can be used as an affinity agent.

EXAMPLE 15

In the production of capsule type minute metallic particles by the procedure of Example 14, the stirring of the suspension was carried out at varying rates of 30, 50, 250, and 300 rpm to determine the effect of the stirring speed on the stability of the suspension.

(Results)

Table 11 shows the effect of the stirring speed (30, 50, 250, and 300 rpm) on the stability of the suspension. The results indicate that the stirring speed must be in the range between 50 and 250 rpm for the sake of suspension stability.

TABLE 11

| | Relation between stirring speed and suspension stability | | | |
|---|---|---|---|---|
| Speed of stirring (rpm) | 30 | 50 | 250 | 300 |
| Suspension stability | Sedimentation of minute | Stable | Stable | Adhesion of minute conductive particles |

TABLE 11-continued

Relation between stirring speed and suspension stability

| Speed of stirring (rpm) | 30 | 50 | 250 | 300 |
|---|---|---|---|---|
| | conductive particles observed | | to beaker wall observed | |

EXAMPLE 16

An MC type conductive filler and a capsule type conductive adhesive agent were produced by following the procedure of Example 14, except that alcohol was used in the place of acetone. They were evaluated in the same manner as in Example 14.

(Results)

In all the items of evaluation, the results were nearly the same as those obtained in Example 14.

This invention is constructed as described above, it enables an MC type conductive filler coated with a thermosetting resin possessed of better characteristic properties than a thermoplastic resin to be produced easily at a low cost. Thus, this invention realizes a practical MC type conductive adhesive agent excellent in reliability and performance.

What is claimed is:

1. A process for producing a microcapsule-type electroconductive filler, comprising the steps of:

a first step of treating electro-conductive metallic particles with a coupling agent, the amount of coupling agent being in the range of 0.1 and 10% by weight, based on the amount of metallic particles;

a second step of mixing the coupling agent treated metallic particles with a solvent in which bisphenol A epoxy resin is dissolved, to coat the bisphenol A epoxy resin onto the surface of the electro-conductive metallic particles;

a third step of dispersing the mixture obtained from said second step in an aqueous phase having a viscosity in the range of between 20 and 10,000 cps and having tetraethylene pentamine dissolved therein, to form an aqueous suspension; and a fourth step of stirring said aqueous suspension at a rate in the range of 50 and 250 rpm to polymerize the bisphenol A epoxy resin and the tetraethylene pentanine to form an insulating resin on the surface of the metallic particles.

2. A process for producing a microcapsule-type electroconductive filler, comprising the steps of:

a first step of treating electro-conductive metallic particles with a coupling agent, the amount of coupling agent being in the range of between 0.1 and 10% by weight, based on the amount of metallic particles;

a second step of mixing the coupling agent treated metallic particles with a solvent in which bismaleimide and diazobicycloundecene are dissolved, to coat the bismaleimide onto the surface of the metallic particles;

a third step of dispersing the mixture obtained from said second step in an aqueous phase having a viscosity in the range of between 20 and 10,000 cps and having tetraethylene pentamine dissolved therein, to form an aqueous suspension; and a fourth step of stirring the aqueous suspension at a rate in the range of 20 and 10,000 rpm to polymerize the bismaleimide and tetraethylene pentamine to form an insulating resin on the surface of the metallic particles.

3. The process according to claim 1, wherein in said fourth step, said bisphenol A epoxy resin and tetraethylene pentamine are polymerized by a catalyst or heating.

4. The process according to claim 2, wherein in said fourth step, said bismaleimide and tetraethylene pentamine are polymerized by a catalyst or heating.

* * * * *

UNITED STATES PATENT AND TRADEMARK OFFICE
CERTIFICATE OF CORRECTION

PATENT NO.: 6,080,443
DATED : June 27, 2000
INVENTOR(S): Hiroaki DATE et al.

It is certified that error appears in the above-identified patent and that said Letters Patent is hereby corrected as shown below:

On the title page, [57] Abstract:

line 5, after "A" insert --such as a bisphenol A epoxy resin or a bismaleimick--;
line 7, after "B" insert --such as a tetrathylene pentamine--;
line 9, change "In situ" to --*In situ*--.

Signed and Sealed this

Third Day of April, 2001

*Attest:*

NICHOLAS P. GODICI

*Attesting Officer*  *Acting Director of the United States Patent and Trademark Office*